United States Patent
Hung et al.

[11] Patent Number: 5,608,287
[45] Date of Patent: Mar. 4, 1997

[54] CONDUCTIVE ELECTRON INJECTOR FOR LIGHT-EMITTING DIODES

[75] Inventors: Liang-Sun Hung, Webster; Ching W. Tang; S. Tong Lee, both of Rochester, all of N.Y.

[73] Assignee: Eastman Kodak Company, Rochester, N.Y.

[21] Appl. No.: 392,657

[22] Filed: Feb. 23, 1995

[51] Int. Cl.$^6$ .................................................. H01J 63/04
[52] U.S. Cl. ........................................... 313/503; 313/504
[58] Field of Search ..................... 313/503, 504, 313/509; 257/79, 94, 10

[56] References Cited

U.S. PATENT DOCUMENTS

| | | | |
|---|---|---|---|
| 4,486,499 | 12/1984 | Morimoto | 313/503 |
| 4,720,432 | 1/1988 | VanSlyke et al. | 313/504 |
| 4,827,318 | 5/1989 | Hall et al. | 357/1 |
| 5,073,446 | 12/1991 | Scozzafava et al. | 428/323 |
| 5,151,629 | 9/1992 | VanSlkye | 313/504 |
| 5,166,094 | 11/1992 | Kapoor | 437/175 |
| 5,202,571 | 4/1993 | Hirabayashi et al. | 257/10 |
| 5,229,628 | 7/1993 | Kobayashi et al. | 313/509 |
| 5,294,869 | 3/1994 | Tang et al. | 313/504 |
| 5,323,053 | 6/1994 | Luryi et al. | 257/485 |
| 5,404,074 | 4/1995 | Watanabe et al. | 313/495 |

OTHER PUBLICATIONS

Tang and VanSlyke, Appl. Phys. Lett. vol. 51, 1987, pp. 913–915.

*Primary Examiner*—Michael Horabik
*Assistant Examiner*—Michael Day
*Attorney, Agent, or Firm*—Raymond L. Owens

[57] ABSTRACT

An electroluminescent device (10) has a bottom electrode layer (13) disposed on a substrate (11) for injecting electrons into an organic layer (15); and a top electrode (17), such as ITO, disposed on the organic layer for injecting holes into the organic layer. The bottom electrode is formed of either metal silicides, such as, rare earth silicides, or metal borides, such as lanthanum boride and chromium boride having a work function of 4.0 eV or less. The electrodes formed from either metal silicates, or metal borides provide protection from atmospheric corrosion.

15 Claims, 1 Drawing Sheet

CONDUCTIVE ELECTRON INJECTOR FOR LIGHT-EMITTING DIODES

FIELD OF INVENTION

The present invention pertains to organic light-emitting diodes and more particularly pertains to a stable metal electrode with a low work function.

BACKGROUND OF THE INVENTION

There is currently interest in the use of organic materials for the fabrication of light-emitting diodes. The primary reason is that a large number of organic materials exist with high fluorescence quantum efficiencies in the visible spectrum, and thus have great potential for multi-color display applications.

In organic light-emitting diodes electrons and holes are injected from the contacts into the organic material and form negatively and positively charged polarons. Photon production occurs through the radiative recombination of the oppositely charged polarons. To achieve the best device performance, the energetics of the organic and electronic materials should be matched. ITO is commonly used as the anode because of its high work function of 4.6 eV, thus acting as an effective hole injector. Good device performance will occur when the work function of the cathode is close to the electron affinity of the polymer. Increasing the work function of the cathode reduces the number of injected electrons, resulting in a higher operating voltage or a lower device efficiency.

Several metals are known to have low work functions and thus are ideally suited for electron injection into organic materials. However, they are susceptible to atmospheric oxidation. For instance, Mg has a work function of 3.7 eV and is a good candidate for the electron injector, while Tang and VanSlyke in Appl. Phys. Lett. Vol. 51, 1987, p. 913–915 described a stability test in which light-emitting diodes with alloyed Mg-Ag cathodes show a steady degradation accompanied by an increase of the drive voltage. Some of the failure is attributed to the degradation of the contacts. To improve the stability a thick indium film greater than one micron is used for encapsulation, as described in U.S. Pat. No. 5,073,446.

One of the major shortcomings presented by the conventional organic light-emitting diode structure is the difficulty in achieving monolithic integration, where, for example, an array of organic light-emitting diodes and the driver electronics are fabricated on a single chip.

In a normal configuration, the light-emitting diode consists of an electron-injecting metal contact on the front surface of an electroluminescent layer on a conductive glass substrate. When a semiconductor wafer such as Si is used as a substrate, the light emission through the substrate is prohibited because of the opaqueness of the substrate. Therefore, a transmissive top electrode is necessary. Since the materials used for the electron injector are highly reactive with oxygen, a thick cathode layer completely encased in several microns of more inert metals such as indium or gold is commonly used, thus light emission through such a top surface is blocked. With a reverse structure where the electron injector is in contact with Si and the hole injector is on top of organic layers, light emission through the top electrode is possible because a transparent indium-tin oxide layer or a semi-transparent thin gold layer can be used as the anode. However the low work function metals are either highly reactive with Si and/or act as a fast diffusing species, thus significantly affecting the device performance.

It is therefore highly desirable to provide a material which has a low work function and yet is relatively stable against oxidation as the cathode for the organic light-emitting diodes. It is also highly desirable to provide a low work function material which is compatible with some semiconductors such as Si, thus allowing integrating organic light-emitting diodes and electronic devices on the same chip.

SUMMARY OF THE INVENTION

It is an object of the invention to provide an electron injector which has a low work function and yet is stable against atmospheric corrosion for light-emitting diodes with various configurations.

It is another object of the invention to provide an electroluminescent device on a semiconductor substrate. This object is achieved in a conductive electrode comprising a material selected from the group consisting of metal silicides and metal borides and having a work function equal or less than 4.0 eV so that the electrode provides good stability against atmospheric corrosion and acts as an electron injector for light-emitting diodes with various configurations.

The device comprises in order: a single crystal semiconductor substrate, a layer of low work function material as an electron injector which is stable relative to atmospheric corrosion and compatible with the substrate, an organic single layer or multilayer structure for electroluminescence and carrier confinement, and a layer of high-work-function material as a hole injector which is transmissive to optical radiation.

In a more specific aspect of the invention, it provides an organic light-emitting diode on Si, comprising in order: a single crystal Si substrate; a layer of rare-earth metal silicides with a low work function, good stability against oxidation and compatibility with Si; an organic multilayer structure including a light emitter such as doped or undoped Alq$_3$ (8-hydroxyquinoline aluminum) and a hole-transport layer such as diamine for carrier confinement; and a layer of high work function material including an indium-tin-oxide layer or a thin gold layer, which is optically transmissive.

DETAILED DESCRIPTION OF THE PREFERRED EMBODIMENTS

Figure 1:
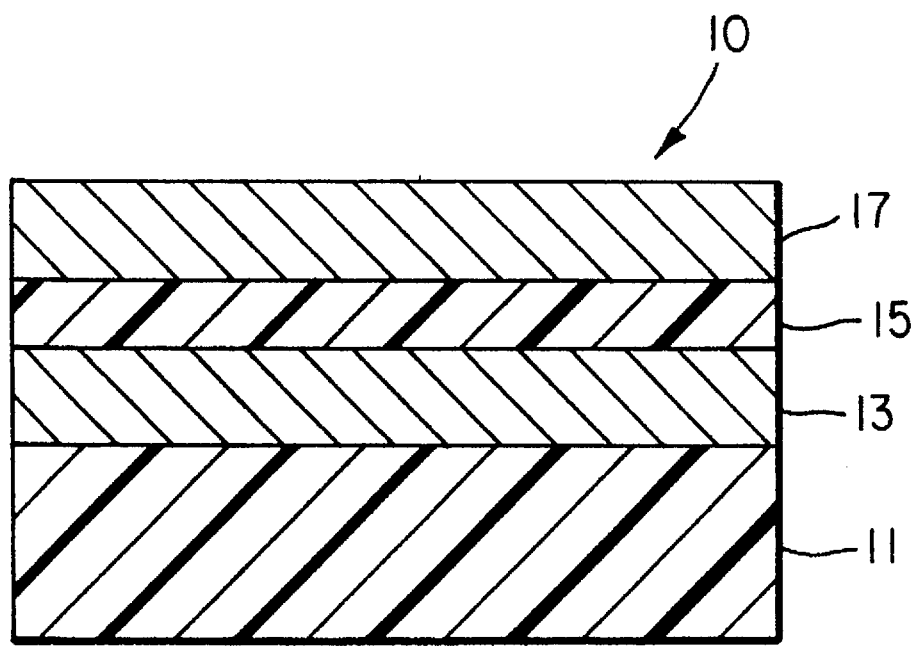
FIG. 1 is a schematic diagram of an embodiment of the electroluminescence device of the invention.

Referring initially to FIG. 1, an electroluminescence device 10 of the invention has, in order, a substrate 11, a bottom electrode layer 13, an organic layer structure 15, a top electrode layer 17.

Substrate 11 is a single crystal semiconductor substrate selected from the group consisting of Si, Ge, GaAs, GaP, GaN, GaSb, InAs, InP, InSb, and Al$_x$Ga$_{1-x}$As, where x is from 0 to 1. Substrate 11 can be either undoped, lightly doped, or heavily doped. Substrate 11 is either bare or covered with a layer of dielectric material such as Si oxides or Si nitrides. In some applications, part of the semiconductor can be used as substrate 11 for electroluminescent device 10, while the remainder of the semiconductor wafer can be processed to form drivers, switchers, or other electronic devices. Bottom electrode layer 13 acts as an electron injector having a low work function with a value equal to or less than 4.0 eV and a relatively good stability against atmospheric oxidation. Bottom electrode layer 13 is compatible with substrate 11 showing no interactions with the substrate. Examples 1 and 2 described in this invention indicate that rare-earth metal silicides and yttrium silicides are suitable materials. Chromium borides and lanthanum borides can also be selected for this purpose because of their well known low work functions and stabilities.

The thickness of bottom electrode layer 13 is so selected that it is sufficient to form a continuous electrode. A useful range of the thickness is from 10 to 1000 nm, preferably 50–500 nm. This bottom electrode layer can be deposited by many conventional means, such as metal deposition followed by thermal annealing or hot-substrate deposition on Si to form silicides, sequential deposition of metal and Si, or codeposition of silicides or borides on substrate 11. Deposition can be carried out using evaporation, sputtering, laser ablation, and chemical vapor deposition.

Organic layer structure 15 either has a single layer acting as a light emitter or a multilayer structure, including a light emitter and carrier-confinement layers. For instance, a useful structure consists of an undoped and doped $Alq_3$ layer as the emitter and a diamine layer for hole-transporting, as described in U.S. Pat. Nos. 5,294,869, and 5,151,629. Suitable materials used for light emitters include poly(paraphenylene vinylene) (PPV), PPV copolymers and derivatives, polyaniline, poly(3-alkylthiophene), poly(3-octylthiophene), poly(paraphenylene), and $Alq_3$. Organic layer structure 15 can be prepared by thermal evaporation or spin-coating from a solution. Top electrode layer 17 acts as a hole injector having a high work function with a value greater than 4.2 eV and good stability in ambient. Top electrode layer 17 is either a transparent conducting oxide or a thin metal layers, thus allowing light-emitting from the top surface. Suitable metal oxides include indium-tin-oxide, aluminum- or indium-doped zinc oxide, tin oxide, magnesium-indium-oxide, and cadmium-tin-oxide. Suitable metals include gold, silver, nickel, palladium, and platinum. When a thin metal layer is used as a hole injector, a transparent encapsulating layer may be needed to protect the organic layered structure from moisture attack. The desired metal oxides and metals can be deposited by evaporation, sputtering, laser ablation, and chemical vapor deposition. A thickness ranging from 50 to 1000 nm for the metal oxide layer is useful as the hole injector, preferably 100–500 nm; and a thickness ranging from 5–50 nm for the metal layer, preferable 10–30 nm.

The following examples and comparative examples are presented for a further understanding of the invention.

EXAMPLE 1

4-inch (111)Si or (100)Si wafers were used as substrates for rear-earth silicide formation. The wafers were sequentially etched in $H_2SO_4$: $H_2O_2$: $H_2O$, $NH_4OH$: $H_2O_2$: $H_2O$, diluted HF and $HNO_3$: $H_2O_2$: $H_2O$ solutions. After a rinse in deionized water, the wafers were blown dry in $N_2$. Prior to being loaded in an evaporator the wafers were subjected to a spin-etch or dip-etch process in an ARA:$H_2O$:HF= 9:0.5:0.5 solution, where ARA is 90% ethanol and 5% each of methanol and isopropyl alcohol.

Erbium films were deposited in an electronbeam evaporator with pressures of $1\times10^{-9}$ Torr prior to deposition, rising to a maximum of $1-2\times10^{-7}$ Torr during deposition. The substrate was heated by a radiative heater consisting of tantalum wires. The growth temperature varied between 300°–400° C. and was monitored by an infrared pyrometer using published emissivity values. The deposition rate was 0.2–0.3 nm·$s^{-1}$ and the thickness of the erbium films was about 100 nm.

X-ray diffraction analysis revealed three peaks centered at $2q=21.7°$, $44.2°$, and $48.1°$, which can be identified as the (001) and (002) and (110) lines of $ErSi_2$. Electrical measurements with a four-point probe showed a low sheet resistivity of about $1\times10^{-4}$ ohm-cm. The strong (001) diffraction peak retained its original intensity, and the resistivity remained unchanged after a 1 hour anneal at 300° C. in air, indicating good stability of $ErSi_2$ against oxidation. UV photoelectron spectroscopy was employed to determine the work function of $ErSi_2$. A value of 3.38±0.1 eV was found, which is significantly lower than the work function 3.7 eV of magnesium. To our knowledge, this is the first report on work functions of rare-earth metal silicides.

EXAMPLE 2

The same Si substrates and processing procedures were employed as described in Example 1, except that 100 nm thick yttrium films were deposited. X-ray diffraction analysis indicated the formation of $YSi_2$ with (001) and (002) reflection lines centered at $2q=21.4°$ and $43.6°$. Electrical measurements with a four-point probe showed a low sheet resistivity of about $1\times10^{-4}$ ohm-cm. The strong (001) diffraction peak retained its original intensity, and the resistivity remained unchanged after a 1 hour anneal at 300° C. in air, indicating good stability of $YSi_2$ against oxidation. UV photoelectron spectroscopy was employed to determine the work function of $YSi_2$. A value of 3.37±0.1 eV was found, which is almost identical to the work function of erbium silicides.

The two examples indicate that both $ErSi_2$ and $YSi_2$ are good candidates for the electron injector grown on Si. Tu et al. in Appl. Phys. Lett. Vol. 38, 1981, p. 626–629 taught us that yttrium silicides and rare-earth metal silicides including dysprosium silicide, erbium silicides, gadolinium silicides, and holmium silicides have low Schottky-barrier heights with a value of about 0.37–0.39 eV. Therefore, one can readily expect that all of rare-earth silicides would have a work function close to the value reported in this invention for $ErSi_2$ and $YSi_2$, thus being capable of acting as the electron injector for organic light-emitting diodes. The following comparative experiments illuminated the significance of the invention.

COMPARATIVE EXPERIMENT 1

In this experiment we illustrate the importance of using a low work function silicide rather than a low work function metal. Yttrium is known to have a low work function of 3.1 eV, but is strongly reactive with oxygen. Yttrium layers with a thickness of 100 nm were deposited on Si encapsulated with thermally grown $SiO_2$. Reflections of yttrium were identified after deposition or after post-deposition annealing at 300° C. in vacuum. However, the intensity of yttrium reflections decreased significantly and some new peaks developed after 5 days at 100° C., indicating the transformation of yttrium into yttrium oxides. The instability in air would preclude the use of yttrium as a stable contact for electron-injecting.

The invention has been described in detail with particular reference to certain preferred embodiments thereof, but it will be understood that variations and modifications can be effected within the spirit and scope of the invention.

PARTS LIST 10 electroluminescence device
11 substrate
13 bottom electrode layer
15 organic layer structure
17 top electrode layer

We claim:

1. A conductive electrode comprising a material selected from the group consisting of metal silicides and metal borides and having a work function equal or less than 4.0 eV so that the electrode provides good stability against atmospheric corrosion and acts as an electron injector for light-emitting diodes with various configurations.

2. The conductive electrode of claim 1 wherein said metal silicides are selected from the group of rare-earth metal silicides and yttrium silicides.

3. The conductive electrode of claim 1 wherein said rare-earth metal silicides include dysprosium silicide, erbium silicides, europium silicides, gadolinium silicides, holmium silicides, and terbium silicides.

4. The conductive electrode of claim 1 wherein said metal borides include lanthanum borides and chromium borides.

5. The conductive electrode of claim 4 wherein said various configurations include a structure comprised in order of a transmissive and conductive support, an organic electroluminescent cell, and a top cathode.

6. An electroluminescent device having light-emitting diodes comprising in order:

a single crystal semiconductor substrate, said substrate being doped or undoped, said substrate being covered, partially covered, or uncovered by a dielectric film;

an electron-injecting electrode layer of a material selected from the group consisting of metal silicides and metal borides and having a work function equal or less than 4.0 eV so that the electrode provides good stability against atmospheric corrosion and acts as an electron injector for the light-emitting diodes with various configurations;

an organic single layer or multilayer structure with some acting as a emitter and the remainder serving for carrier confinement or hole-transporting; and a hole-injecting electrode layer having a work function equal or greater than 4.2 eV and a good stability against atmospheric oxidation at device operation temperature, said hole-injecting electrode being or not being encapsulated.

7. The semiconductor substrate of claim 6 wherein said substrate is selected from the group consisting of Si, Ge, GaAs, GaP, GaN, GaSb, InAs, InP, InSb, and $Al_xGa_{1-x}As$, where x is from 0 to 1.

8. The electroluminescent device of claim 6 wherein said metal silicides are selected from the group of rare-earth metal silicides and yttrium silicides.

9. The electroluminescent device of claim 8 wherein said rare-earth metal silicides include dysprosium silicide, erbium silicides, europium silicides, gadolinium silicides, holmium silicides, and terbium silicides.

10. The electroluminescent device of claim 6 wherein said metal borides include lanthanum borides and chromium borides.

11. The electroluminescent device of claim 6 wherein said light emitter is selected from the group of poly(paraphenylene vinylene) (PPV), PPV copolymers and derivatives, polyaniline, poly(3-alkylthiophene), poly(3-octylthiophene), poly(paraphenylene), and 8-hydroxyquinoline aluminum ($Alq_3$).

12. The electroluminescent device of claim 6 wherein said hole-injecting electrode is selected from the group of transparent conducting oxides.

13. The electroluminescent device of claim 6 wherein said transparent conducting oxides include indium-tin-oxide, aluminum- or indium-doped zinc oxide, tin oxide, magnesium-indium-oxide, and cadmium-tin-oxide.

14. The electroluminescent device of claim 6 wherein said hole-injecting electrode is selected from the group of noble and near-noble metals.

15. The electroluminescent device of claim 6 wherein said noble and near-noble metals include gold, silver, nickel, palladium, and platinum.

* * * * *